United States Patent
Wuu et al.

(10) Patent No.: US 8,276,039 B2
(45) Date of Patent: Sep. 25, 2012

(54) ERROR DETECTION DEVICE AND METHODS THEREOF

(75) Inventors: John J. Wuu, Fort Collins, CO (US); Samuel D. Naffziger, Fort Collins, CO (US); Donald R. Weiss, Fort Collins, CO (US)

(73) Assignee: Globalfoundries Inc.

( * ) Notice: Subject to any disclaimer, the term of this patent is extended or adjusted under 35 U.S.C. 154(b) by 843 days.

(21) Appl. No.: 12/394,701

(22) Filed: Feb. 27, 2009

(65) Prior Publication Data

US 2010/0223525 A1    Sep. 2, 2010

(51) Int. Cl.
*H03M 13/00* (2006.01)
(52) U.S. Cl. .................. 714/758; 714/753; 714/755
(58) Field of Classification Search .................. 714/753, 714/755, 758
See application file for complete search history.

(56) References Cited

U.S. PATENT DOCUMENTS

| | | | | |
|---|---|---|---|---|
| 6,467,060 B1 * | 10/2002 | Malakapalli et al. | ......... | 714/758 |
| 6,907,559 B2 * | 6/2005 | Hall et al. | ....... | 714/769 |
| 7,644,337 B2 * | 1/2010 | Ito et al. | ......... | 714/755 |
| 7,665,007 B2 * | 2/2010 | Yang et al. | ....... | 714/755 |
| 7,797,609 B2 * | 9/2010 | Neuman | ........ | 714/758 |
| 8,051,339 B2 * | 11/2011 | Sung et al. | ....... | 714/710 |
| 2004/0199851 A1 * | 10/2004 | Quach et al. | .......... | 714/758 |
| 2005/0060630 A1 * | 3/2005 | Hassner et al. | ........... | 714/758 |
| 2009/0089644 A1 * | 4/2009 | Mead | ........ | 714/758 |
| 2009/0150747 A1 * | 6/2009 | Erez | ............. | 714/755 |
| 2009/0282322 A1 * | 11/2009 | Wong et al. | ........... | 714/807 |

* cited by examiner

*Primary Examiner* — Joshua Lohn

(57) ABSTRACT

A first error detection for a first data word is performed using a first error correction code associated with the first data word. In response to the first error detection indicating a first uncorrectable error at the first data word based upon the first error correction code, a second error detection for a plurality of data words including the first data word and a second data word is performed using a second error correction code based upon the first and second data words.

20 Claims, 5 Drawing Sheets

ERROR DETECTION DEVICE AND METHODS THEREOF

BACKGROUND

1. Field of the Disclosure

The present disclosure relates generally to electronic devices, and more particularly to data processing devices.

2. Description of the Related Art

A data processing device such as a microprocessor often includes cache memory in addition to a central processing unit. Cache memory increases the computational performance of a data processing device by providing local storage for information that the data processing device is manipulating. The central processing unit is able to access data that is stored in a local cache memory considerably faster than it can fetch the data from an external memory device.

Cache memory at the microprocessor typically is organized using levels. A level-one (L1) cache memory contains relatively few data entries, and is the memory that can provide needed data to the central processing unit most efficiently. The ability to access data from each subsequent level of cache is less efficient than respective previous levels. For example, desired data stored at the L2 cache will be provided to the central processing unit if a miss occurs in the L1 cache, though the desired data may not be provided to the data processor as quickly from the L2 cache as from the L1 cache. Higher-level caches are typically larger than lower-level caches. For example, a L3 cache memory typically is configured to store a relatively large number of data entries as compared to the L2 or L1 caches. In order to provide a large-capacity L3 cache memory without the cache occupying an unacceptably large portion of the IC die area, the individual transistors and storage capacitor that make up the L3 cache memory bit-cell are usually relatively small. Unfortunately, the small size of the transistors and capacitors can make the L3 cache memory more susceptible to data corruption, resulting in an increased error rate compared to the L1 and L2 cache memories.

A memory error can include either a hard error or a soft error. A hard error can result from a marginally or fully defective transistor or by signal noise that causes a data value to be improperly stored or retrieved. A soft error can result from the interaction of ionizing radiation with the memory bit-cell. Radiation can include neutrons that typically originate in outer space, or alpha particles that originate from materials present in the integrated circuit package. A data processing device can implement error detection and error correction protocols in order to increase the reliability of the data processing device.

BRIEF DESCRIPTION OF THE DRAWINGS

The present disclosure may be better understood, and its numerous features and advantages made apparent to those skilled in the art by referencing the accompanying drawings.

DETAILED DESCRIPTION

Error detection and error correction protocols typically make use of an error correction code (ECC). An ECC is calculated based on the value of a data word, and the ECC is stored along with the original data word. Upon retrieval of the data word from a storage device, such as a semiconductor memory, the ECC associated with each data word can be used by an ECC algorithm to verify the accuracy of the data word. Some ECC algorithms are capable of correcting one or more detected errors. Error detection and correction using ECC algorithms are generally based on cyclic redundancy or Hamming distance algorithms. Different ECC algorithms can provide a range of error correction and detection capabilities. For example, single-error-correct, double-error-detect (SECDED) algorithms can provide detection of up to two data bit errors, and can correct a single bit error in a particular data word. Memories, such as a L3 cache memory may benefit from the use of a double-error-correct, triple-error-detect (DECTED) algorithm that is capable of detecting three errors and can correct two bit errors in a particular data word. A DECTED ECC typically includes a greater number of ECC checkbits than does a SECDED ECC. A DECTED algorithm provides greater detection and correction capabilities than a SECDED algorithm, but the use of the DECTED algorithm can result in increased data latency due to the greater number of steps required to perform the DECTED algorithm. For example, the SECDED algorithm can evaluate the integrity of a data word in approximately one clock cycle, whereas approximately two clock cycles are required to perform the DECTED algorithm.

The disclosure herein achieves increased memory data integrity associated with a DECTED algorithm while taking advantage of the data latency associated with a SECDED algorithm. This level of reliability and performance is achieved using a combination of error correction and detection techniques. In one embodiment, SECDED ECC checkbits are associated with a single data word, and DECTED ECC checkbits are associated with a group of data words. The SECDED algorithm is executed following the access of each data word from a memory, and the DECTED algorithm is executed only if the SECDED algorithm encountered but failed to correct an error. Furthermore, the L3 cache memory can use the combined SECDED and DECTED technique, and the DECTED ECC checkbits can be removed from the data words before storing the data words at the L2 cache memory.

Figure 1:
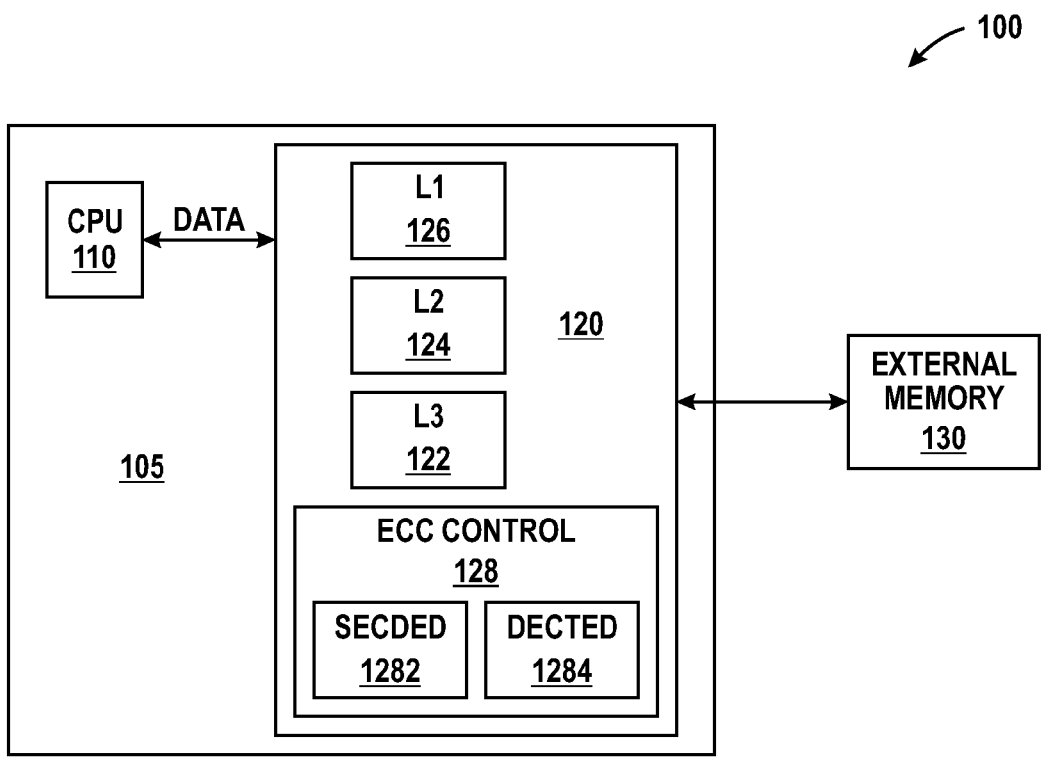
FIG. 1 is a block diagram illustrating a device referred to as a data processing system in accordance with a specific embodiment of the present disclosure.

FIG. 1 is a block diagram illustrating a device referred to as a data processing system 100 in accordance with a specific embodiment of the present disclosure. Data processing system 100 includes a data processing device 105 and an external memory 130. Data processing device 105 includes a central processing unit (CPU) 110 and a cache memory module 120. Cache memory module 120 includes an L3 cache memory 122, an L2 cache memory 124, an L1 cache memory 126 and an ECC control module 128. ECC control module 128 includes SECDED ECC module 1282 and DECTED ECC module 1284.

CPU 110 has a bidirectional interface labeled "DATA" to exchange information with cache memory module 120. Cache memory module 120 has a second bidirectional interface to exchange information with external memory 130. Cache memory module 120 provides local storage, e.g., memory at the same integrated circuit as CPU 110, for information that the data processing device is manipulating. CPU 110 can access data that is stored at cache memory module 120 considerably faster than it can fetch the data from external memory device 130. Cache memory module 120 includes ECC control module 128 that is configured to detect that data accessed from one of cache memories 122, 124, and 126 is erroneous, and to correct the error under certain circumstances. ECC control module 128 includes SECDED and DECTED ECC modules that can operate together as disclosed herein. SECDED ECC module 1282 and DECTED ECC module 1284 can be replicated such that cache memories 122, 124, and 126 each have associated ECC modules. Thus, data can be accessed, and error detection and correction can be performed, at each cache memory concurrently.

L3 cache memory 122 is configured to provide storage for a large amount of data relative to L2 cache memory 124 and L1 cache memory 126. Due to the larger amount of data stored at the L3 cache, bit cells of the L3 cache may include smaller transistors than included at L2 cache memory 124 and L1 cache memory 126. This smaller size can be substantial enough to increase the incidence of hard and soft errors associated with the L3 cache as compared to that associated with L2 cache memory 124 and L1 cache memory 126. L3 cache memory 122 generally includes a greater number of bit cells than L2 cache memory 124 or L1 cache memory 126, which can also increase the chance of an error occurring at L3 cache memory 122. Furthermore, L3 cache memory 122 may be configured to operate at a lower voltage than L2 cache memory 124 and L1 cache memory 126 to reduce power consumption, which can also increase the chance of an error occurring at L3 cache memory 122. Data stored at L3 cache memory 122 includes ECC checkbits corresponding to both SECDED and DECTED ECC algorithms. SECDED ECC checkbits are associated and stored with each data word stored at L3 cache memory 122. DECTED ECC checkbits are determined based on four data words and the DECTED ECC checkbits are distributed amongst the four data words.

Each data word accessed from L3 cache memory 122 is evaluated using the SECDED algorithm. If the data word accessed from L3 cache memory 122 includes a single bit-error, SECDED module 1282 is configured to correct the error. If the data word accessed from L3 cache memory 122 includes two bit-errors, the SECDED algorithm is unable to correct the errors. If a data word is determined to contain an uncorrectable error, DECTED ECC module 1284 is used to attempt to correct the error. DECTED ECC module 1284 is configured to receive four successive data words and their corresponding four sets of ECC SECDED bits. Each of the data words includes a portion of the DECTED ECC checkbits. Four successive data words are accessed from L3 cache memory 122 and the DECTED ECC checkbits associate with each data word are accumulated to provide a complete set of DECTED ECC checkbits. The four data words can be accessed sequentially or the four data words can be received from L3 cache memory 122 as a 512-bit word in response to a single access. Note that the SECDED ECC bits and the DECTED ECC bits can be stored at the same cache line as the 512-bit data word by implementing a larger cache line, such as a cache line having 548 bits for a 9-bit SECDED ECC and a 21-bit DECTED ECC. The DECTED algorithm uses the set of DECTED ECC checkbits to evaluate the combined four data words. The DECTED algorithm is capable of correcting two single bit-errors in the combined 512-bit data value. Furthermore, the DECTED ECC checkbits can also correct errors that may occur at bits that are part of the SECDED ECC checkbits or in the twenty-one bit DECTED ECC checkbits itself.

L2 cache memory 124 is configured to provide intermediate storage for data. L2 cache memory 124 can receive data from L3 cache memory 122 and provide data to L1 cache memory 126. Data stored at L2 cache memory 124 can include ECC checkbits corresponding to both SECDED and DECTED ECC algorithms and data accessed from L2 cache memory 124 can be evaluated using the SECDED and DECTED algorithm as described with reference to L3 cache memory 122. Alternatively, DECTED ECC checkbits can be removed before storing data at L2 cache memory 124, whereby data accessed from L2 cache memory 124 is evaluated using only the SECDED algorithm.

L1 cache memory 126 typically contains fewer data words than L2 cache memory 124 and L3 cache memory 122. Furthermore, L1 cache memory 126 includes a relatively robust storage bit-cell that is relatively resistant to soft data errors. Therefore, data stored at L1 cache memory 126 can include a different error detection algorithm, such as an algorithm that only uses parity checkbits, whereby data accessed from L1 cache memory 126 is evaluated using a parity algorithm. The parity algorithm is able to identify some data errors but is unable to correct an error. If an error is detected, a copy of the required data can be accessed from another location.

If CPU 110 requires data that is not available at cache memory module 120, the data is accessed from external memory 130. Cache memory module 120 can pre-fetch data from external memory 130 and can regulate the distribution copies of data at one or more of cache memories 122, 124, and 126 using a cache coherency protocol.

Figure 2:
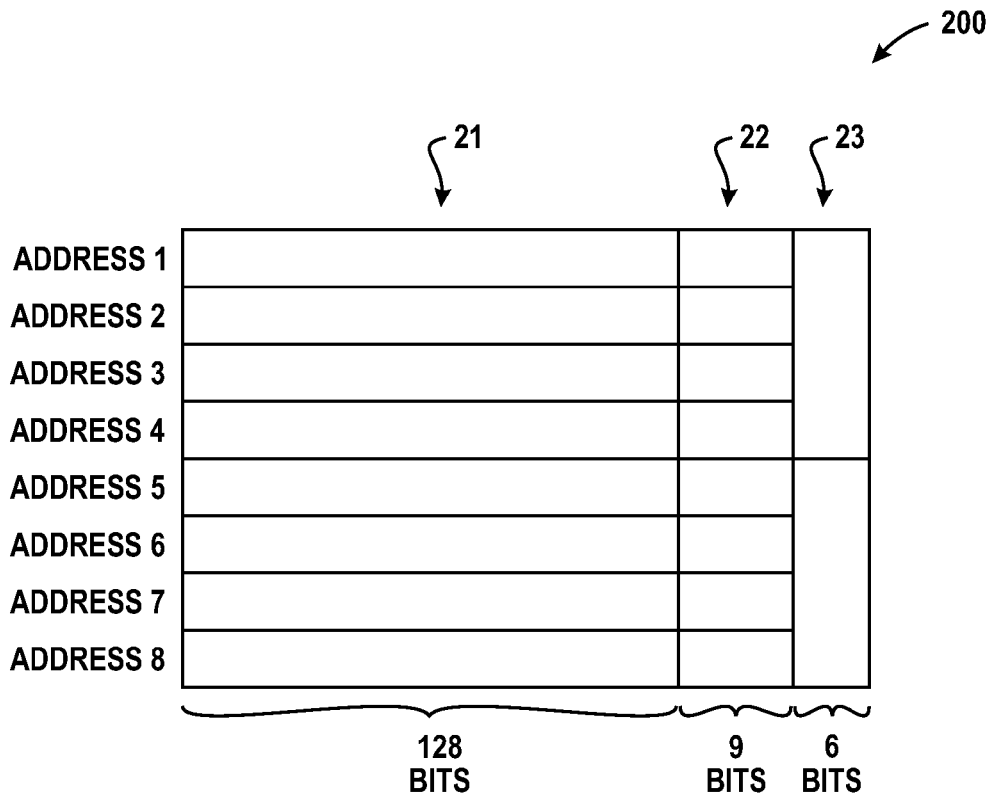
FIG. 2 is a graph illustrating how data and ECC checkbits are stored at the L3 cache memory of FIG. 1 in accordance with a specific embodiment of the present disclosure.

FIG. 2 is a graph 200 illustrating how data and ECC checkbits are stored at L3 cache memory 122 in accordance with a specific embodiment of the present disclosure. Graph 200 includes eight data locations at L3 cache memory 122, and each data location has a corresponding address labeled ADDRESS1, ADDRESS2, ADDRESS3, ADDRESS4, ADDRESS5, ADDRESS6, ADDRESS7, and ADDRESS8. Each data location includes a portion 21, a portion 22, and a portion 23. For a particular data location, portion 21 represents a 128-bit data word, portion 22 represents SECDED ECC checkbits associated with the 128-bit word at the particular data location, and portion 23 includes a portion of a set of DECTED ECC checkbits associated with the 128-bit word at the particular data location, and three other data 128-bit words at three other data locations. The set of DECTED ECC checkbits is determined based on the 128-bit word at the particular data location and the three other data 128-bit words, which can be successive 128-bit data words. Four unique portions of the set of DECTED ECC checkbits are distributed amongst four successive entries as portions 23. For example, the location corresponding to ADDRESS1 receives the first portion of the set of DECTED ECC checkbits, ADDRESS2 receives a second portion of the set of DECTED ECC checkbits, ADDRESS3 receives a third portion of the set of DECTED ECC checkbits, and ADDRESS4 receives a fourth and final portion of the set of DECTED ECC checkbits. The next four locations corresponding to ADDRESS5, ADDRESS6, ADDRESS7, and ADDRESS8 each include a 128-bit data word, corresponding SECDEC ECC checkbits, and a unique portion of a set of DECTED ECC checkbits based on a combination of these four 128-bit data words.

Figure 3:
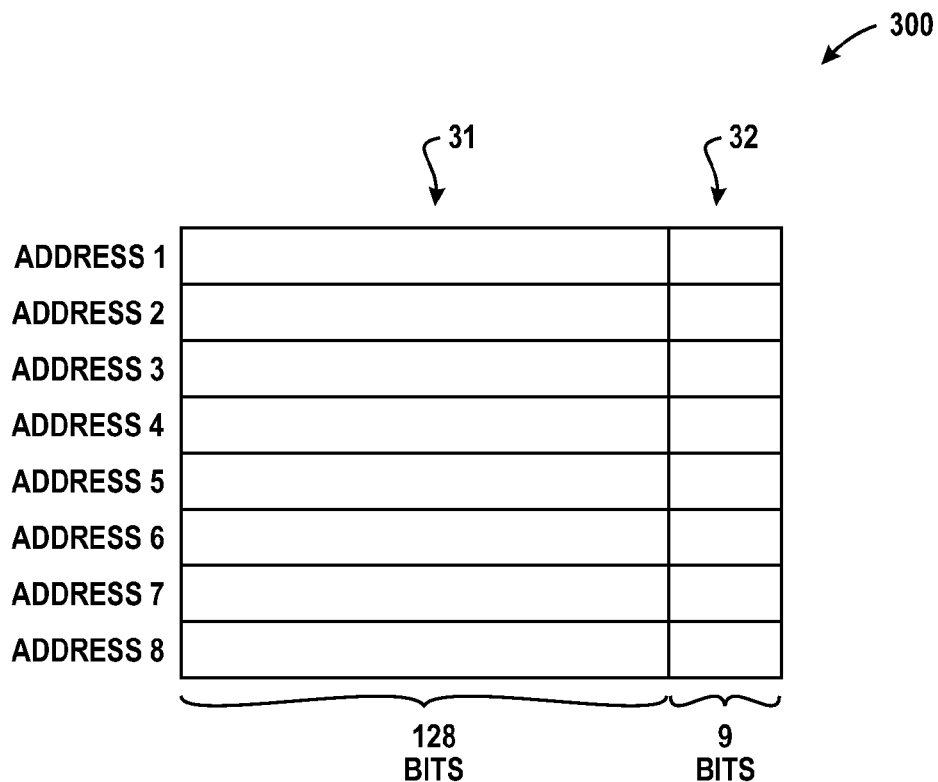
FIG. 3 is a graph illustrating how data and ECC checkbits are stored at the L2 cache memory of FIG. 1 in accordance with a specific embodiment of the present disclosure.

FIG. 3 is a graph 300 illustrating how data and ECC checkbits are stored at L2 cache memory 124 in accordance with a specific embodiment of the present disclosure. Graph 300 includes eight data locations at L2 cache memory 124, and each data location has a corresponding address labeled ADDRESS1, ADDRESS2, ADDRESS3, ADDRESS4, ADDRESS5, ADDRESS6, ADDRESS7, and ADDRESS8. Each location includes portion 31 and portion 32. Portion 31 represents a 128-bit data word, and portion 32 represents SECDED ECC checkbits corresponding to that 128-bit word.

Figure 4:
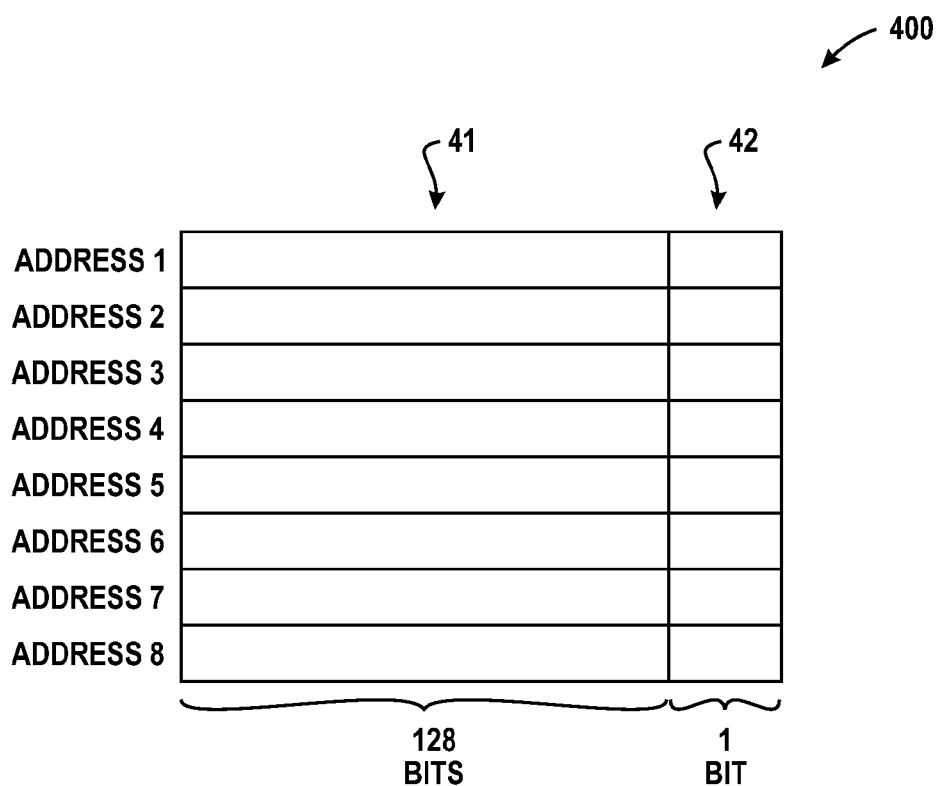
FIG. 4 is a graph illustrating how data and a parity checkbit are stored at the L1 cache memory of FIG. 1 in accordance with a specific embodiment of the present disclosure.

FIG. 4 is a graph 400 illustrating how data and a parity checkbit are stored at L1 cache memory 126 in accordance with a specific embodiment of the present disclosure. Graph 300 includes eight data locations at L1 cache memory 126, and each data location has a corresponding address labeled ADDRESS1, ADDRESS2, ADDRESS3, ADDRESS4, ADDRESS5, ADDRESS6, ADDRESS7, and ADDRESS8. Each location includes portion 41 and portion 42. Portion 41 represents a 128-bit data word, and portion 42 represents a parity checkbit corresponding to that 128-bit word.

Figure 5:
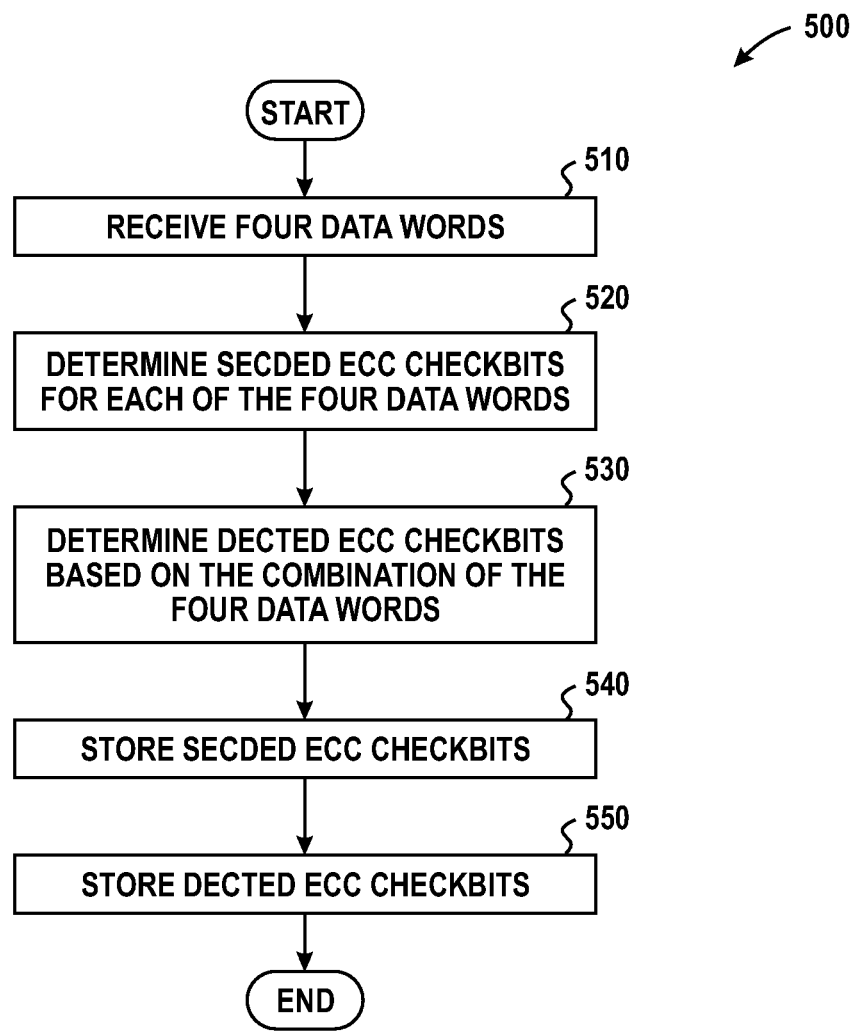
FIG. 5 is a flow diagram illustrating a method in accordance with a specific embodiment of the present disclosure.

FIG. 5 is a flow diagram illustrating a method 500 in accordance with a specific embodiment of the present disclosure. Method 500 illustrates how SECDED and DECTED ECC checkbits are determined and how the ECC checkbits are stored in relation to the storage of data words at L3 cache memory 122. Method 500 starts at block 510 where four 128-bit data words are received for storage at L3 cache memory 122. The data can be provided by external memory 130 or from other portions of data processing device 105. The flow proceeds to block 520 where SECDED ECC checkbits are determined with each of the four data words. The flow proceeds to block 530 where a single set of DECTED ECC checkbits is determined based on a combination of the four 128-bit data words and based on the SECDED ECC checkbits associated with each of the four 128-bit data words. In a particular embodiment, the SECDED ECC checkbits associated with each of the 128-bit data words includes nine bits of data, and the single set of DECTED ECC checkbits includes twenty-one bits of data.

The flow proceeds to block 540 where the SECDED ECC checkbits are stored. In one embodiment, the SECDED ECC checkbits for a particular data word are associated with that data word by being stored at a common address as the data word. For example, the SECDED ECC can be concatenated with its corresponding 128-bit data word. At block 550, a unique portion of the set of DECTED ECC checkbits is stored. The DECTED ECC check bits can be associated with the four data words by being stored at an address corresponding to the four data words (not illustrated), or by storing different portions of the DECTED ECC check bits at addresses corresponding to the four data words. For example, the DECTED ECC check bits can be concatenated with each of the four 128-bit data words so that the set of DECTED ECC checkbits is distributed amongst the four 128-bit data words. The four 128-bit data words and associated ECC checkbits are stored at L3 cache memory 122. For example, the first 128-bit data word is concatenated with a corresponding nine-bit SECDED ECC checkbits determined based on that particular data word. The first data word is further concatenated with the first six bits of the set of DECTED ECC checkbits to produce a contiguous 143-bit data value that is stored at L3 cache memory 122. Each of the next three data words are each concatenated with their respective nine-bit set of SECDED ECC checkbits and further concatenated with a unique six-bit portion of the set of DECTED ECC checkbits to provide three additional 143-bit data values that are each stored at L3 cache memory 122. Note that because the set of DECTED ECC checkbits includes twenty-one bits of information, one portion of the DECTED ECC checkbits distributed amongst the four 128-bit data words includes only three bits of information, and the remaining three bits of the six bit portion can be set to zero, and are ignored. In another embodiment, the three unused bits can be set to zero and distributed amongst the four 128-bit data words.

Figure 6:
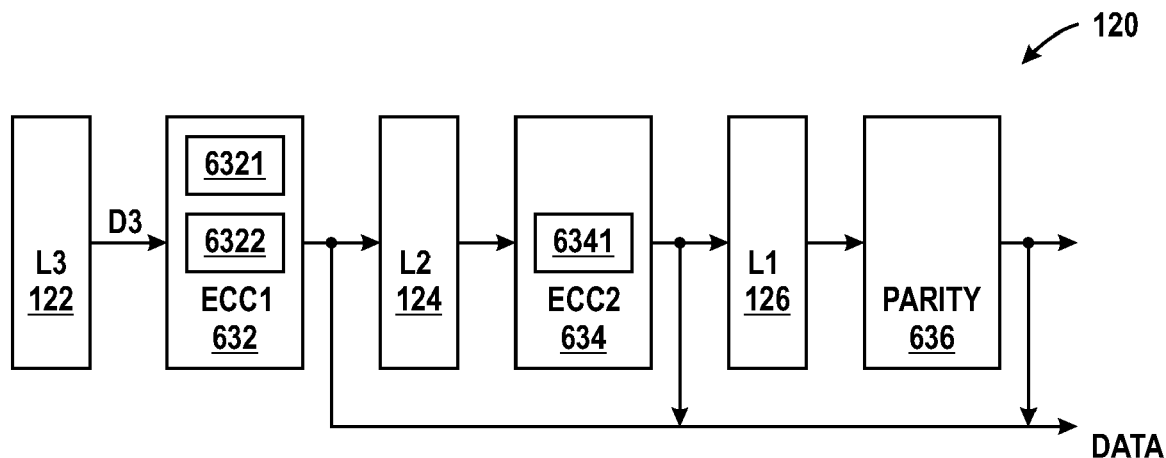
FIG. 6 is a block diagram illustrating a cache memory module of FIG. 1 in accordance with a specific embodiment of the present disclosure.

FIG. 6 is a block diagram illustrating cache memory module 120 of FIG. 1 in accordance with a specific embodiment of the present disclosure. Cache memory module 120 includes L3 cache memory 122, L2 cache memory 124, L1 cache memory 126, error correction module 632 labeled "ECC1," error correction module 634 labeled "ECC2," and error detection module 636 labeled "PARITY." ECC1 632 includes two different error detection and correction modules, a SECDED ECC module 6321 and DECTED ECC module 6322. ECC2 634 includes a single error detection and correction module SECDED ECC module 6341. L3 cache memory 122 has an output connected to a node labeled "D3." ECC1 632 has an input connected to node D3 and an output connected to an input of L2 cache memory 124 and to node DATA. L2 cache memory 124 has an output connected to an input of ECC2 634. ECC2 634 has an output connected to an input of L1 cache memory 126 and to node DATA. L1 cache memory 126 has an output connected to an input of PARITY module 636, and PARITY module 336 has an output connected to node DATA.

In response to a request for data by CPU 110, a hit at L1 cache memory 126 will result in cache memory module 120 providing the requested data from L1 cache memory 126. A miss at L1 cache memory 126 and a hit at L2 cache memory 124 will result in cache memory module 120 providing the requested data from L2 cache memory 124. A miss at L1 and L2 cache memories 126 and 124, and a hit at L3 cache memory 122 will result in cache memory module 120 providing the requested data from L3 cache memory 122. A miss at all caches will result in cache memory module 120 providing the requested data from a non-local cache location, such as from external memory 130, if necessary.

Cache memory module 120 attempts to anticipate which data values are likely to be requested by CPU 110, and copies the anticipated data from L3 cache memory 122 to L2 cache memory 124, and from L2 cache memory 124 to L1 cache memory 126. Speculatively copying data into a cache memory is called pre-fetching. For example, cache memory module 120 can pre-fetch data from L3 cache memory 122 and store the data at L2 cache memory 124, or can pre-fetch data from L2 cache memory 124 and store the data at L1 cache memory 126.

In order to improve the reliability of data processing device 105, data stored at each of L1 cache memory 126, L2 cache memory 124, and L3 cache memory 122 can be accompanied by ECC or parity checkbits. An error correction module uses the associated ECC checkbits to attempt to verify the integrity of data accessed from a cache memory. For example, data accessed from L3 cache memory 122 includes 143-bit data values. ECC module 632 receives the 143-bit data value and separates the original 128-bit data word from the corresponding nine-bit set of SECDED ECC checkbits and the six-bit portion of the set of DECTED ECC checkbits. ECC1 632 uses the nine-bit set of SECDED ECC checkbits to evaluate the integrity of the 128-bit data word. ECC1 632 retrieves the next three 143-bit data values from L3 cache memory 122, and the same procedure is repeated on each of the three 128-bit data words. If each of the four 128-bit data words is either confirmed to be correct, or are fully corrected by ECC1 632 using the SECDED algorithm, the four 128-bit data words can be written to L2 cache memory 124 or provided to output node DATA. In an embodiment, 128 b data words can be preemptively provided to L2 cache memory 124 or to node DATA before error detection and correction is performed on all four of the 128-bit data words. If an uncorrectable error is detected in a subsequent data word of the four data words, previously transmitted data words can be flushed from associated architectural pipelines, and the DECTED ECC checkbits can be used to attempt to correct the error.

If any of the four 128-bit data words cannot be corrected using the SECDED algorithm, the DECTED algorithm is used to attempt to correct the error. The four 128-bit data words are concatenated into a single 512-bit data value. Each of the four six-bit portions of the set of DECTED ECC checkbits associated with a respective 128-bit data words are concatenated to provide a twenty-one-bit set of DECTED ECC checkbits. ECC1 632 uses the DECTED algorithm and the set of DECTED ECC checkbits to attempt to correct the error or errors in the 512-bit data value or errors in the SECDED ECC checkbits. If ECC1 632 is able to correct the error, than the data can be written to L2 cache memory 124 or provided to output node DATA. In a particular embodiment, the SECDED ECC checkbits and the 512-bit data value can be stored at L2 cache memory 124 as four 137-bit data words, where each word includes a 128-bit data word and the previously determined corresponding 9-bit set of SECDED ECC checkbits. Thus, SECDED ECC checkbits do not need to be re-calculated before storing the data words at L2 cache memory 124. In another embodiment, data can be stored at L2 cache memory 124 in the same manner as used at L3 cache memory 122, including both SECDED and DECTED sets of ECC checkbits.

ECC2 634 is configured to evaluate data retrieved from L2 cache memory 124. In an embodiment of the present disclosure, each 128-bit data word stored at L2 cache memory 124 is accompanied by a nine-bit set of SECDED ECC checkbits. ECC2 634 processes each 128-bit data word using a SECDED algorithm and the set of SECDED ECC checkbits associated with each 128-bit data word, and corrects the data word if a single bit error is detected. If the data word can not be corrected, a copy of the data word can be retrieved from L3 cache memory 122 or external memory 130. ECC2 634 can provide data to L1 cache memory 126 or to output node DATA. L1 cache memory 126 is generally a static random access memory and not substantially susceptible to radiation-induced soft errors. Thus, a data stored at L1 cache memory 126 is accompanied by parity checkbits. ECC2 634 removes the SECDED checkbits included with each 128-bit data word stored at L2 cache memory 124 and provides a parity checkbit. ECC2 634 can store the 128-bit data word and associated parity checkbit at L1 cache memory 126, or provide the 128-bit data word at output node DATA. Parity module 636 is configured to evaluate data accessed from L1 cache memory 126 using a parity algorithm. If parity module 636 determines that the parity of the 128-bit data word is consistent with the parity checkbit, the data is provided to CPU 110 at output node DATA. If parity module 636 determines that the parity of the 128-bit data word is not consistent with the parity checkbit, a copy of the required data word can be retrieved from another location.

Figure 7:
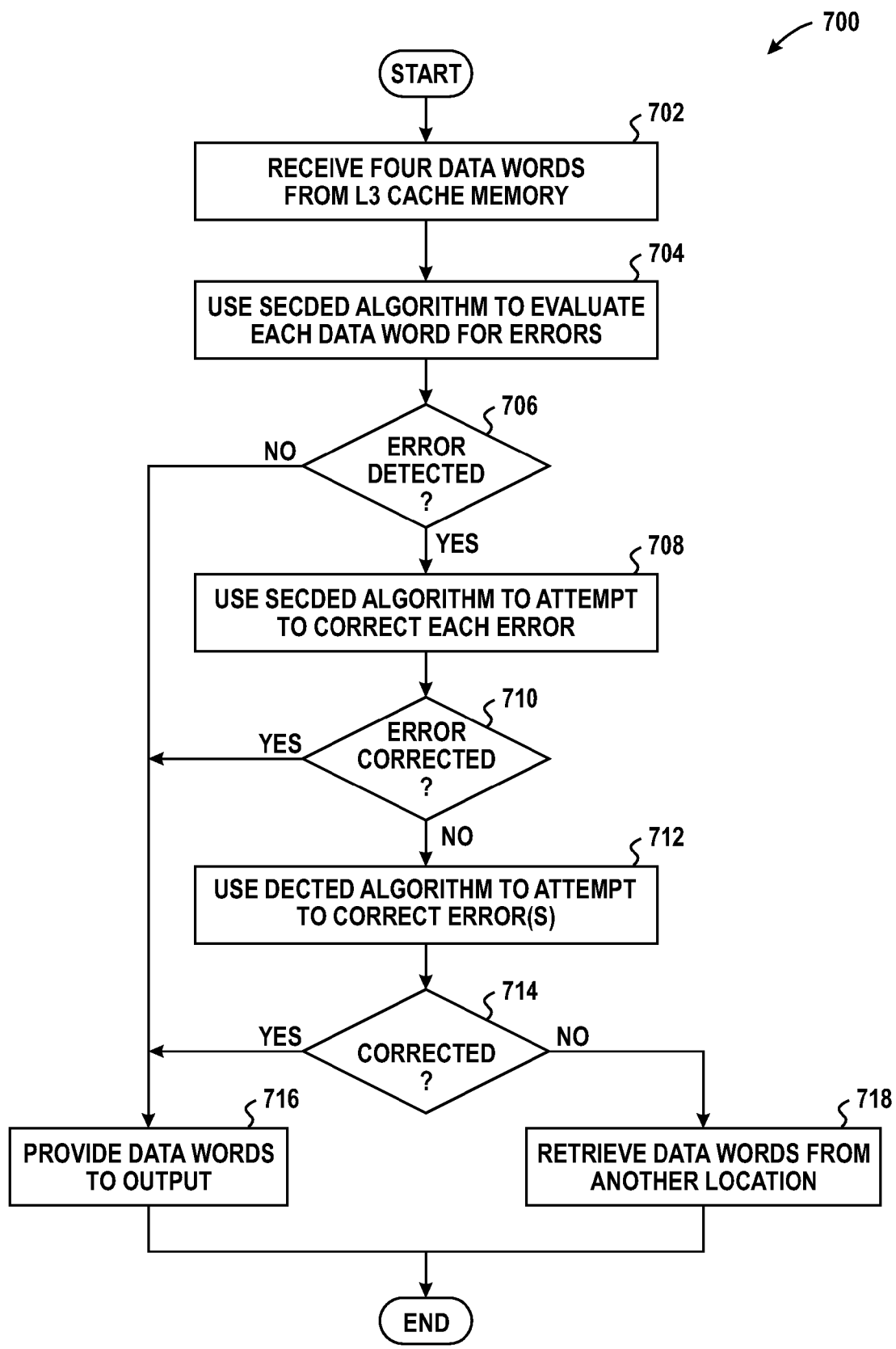
FIG. 7 is a flow diagram illustrating a method in accordance with a specific embodiment of the present disclosure.

FIG. 7 is a flow diagram 700 illustrating the operation of ECC1 632 of FIG. 6 in accordance with a specific embodiment of the present disclosure. Flow diagram 700 begins at block 702 where four data words and associated ECC checkbits are received. The flow proceeds to block 704 where each data word is evaluated for errors using a SECDED algorithm. If the four data words are received sequentially from L3 cache memory 122, the SECDED algorithm can be performed on each data word sequentially after each data word is received. If no errors are detected, the flow proceeds from decision block 706 to block 716 where the four data words are provided at output node DATA. If any data word contains an error, the flow proceeds from decision block 706 to block 708 where the SECDED algorithm is used to attempt to correct each error. If all errors are corrected, the flow proceeds from decision block 710 to block 716. If any error remains uncorrected, the flow proceeds from decision block 710 to block 712 where the four data words are evaluated together using the DECTED algorithm in attempt to correct the error(s). If all errors are successfully corrected, the flow proceeds from decision block 714 to block 716. If any error remains uncorrected, the flow proceeds from decision block 714 to block 718 where the desired data is retrieved from an alternate location.

Figure 8:
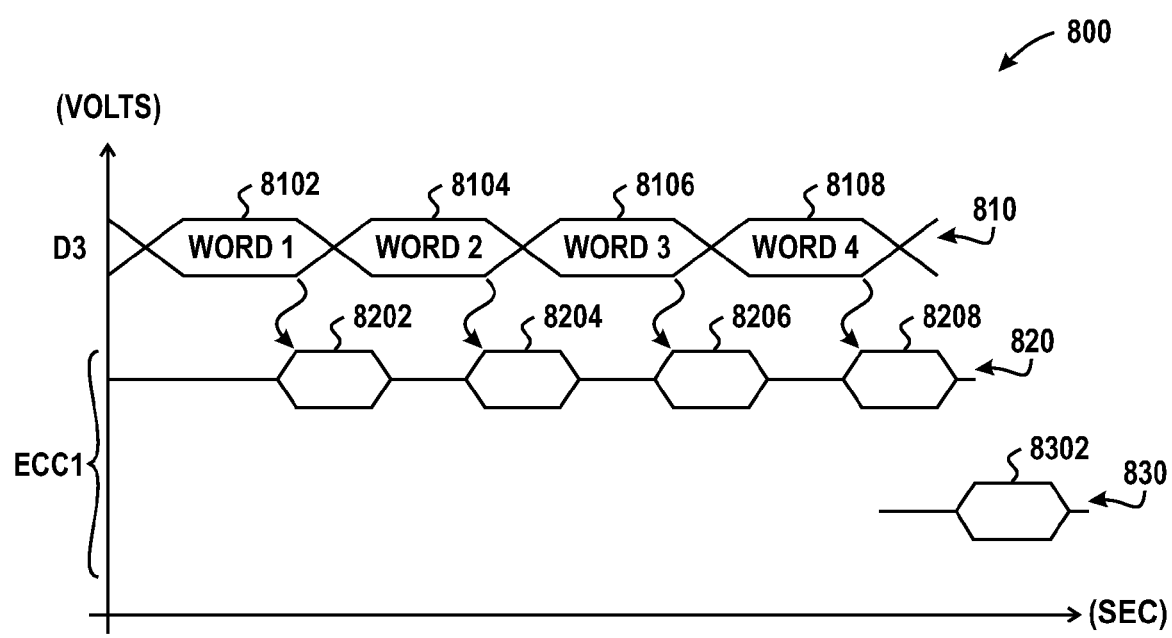
FIG. 8 is a timing diagram illustrating the operation of an error correction module of FIG. 6 in accordance with a specific embodiment of the present disclosure.

FIG. 8 is a timing diagram 800 illustrating the operation of ECC1 632 of FIG. 6 in accordance with a specific embodiment of the present disclosure. Timing diagram 800 includes a horizontal axis representing time in units of seconds, and a vertical axis representing voltage in units of volts. Timing diagram 800 includes a waveform 810 representing signal D3 of FIG. 6, a waveform 820 representing the results of SECDED error correction at ECC1 632, and waveform 830 representing the results of DECTED error correction at ECC1 632. Waveform 820 includes individual correction results 8202, 8204, 8206, and 8208. Waveform 830 includes a correction result 8302.

Timing diagram 800 illustrates a burst access of L3 cache memory 122 wherein four 143-bit data values are sequentially retrieved from L3 cache memory 122. Each 143-bit data value includes a 128-bit data word, a nine-bit set of SECDED ECC checkbits, and a six-bit portion of the set of DECTED ECC checkbits. ECC1 632 uses the set of SECDED ECC checkbits that accompany the first 128-bit data word to check the first 128-bit data word for errors. The result 8202 of the check is illustrated at ECC1 waveform 820. For example, a logic-high value of result 8202 indicates that ECC1 632 determined that the first 128-bit data word is correct or was successfully corrected. A logic-low value of result 8202 indicates that an error was detected and that the error could not be corrected, such as a two-bit error. ECC1 632 evaluates each successive 128-bit data word and provides corresponding results 8204, 8206, and 8208. If all four results 8202, 8204, 8206, and 8208 indicate that the associated data contains no errors, or that an identified error is corrected, the four 128-bit data words can be written to L2 cache memory 124 or provided at output node DATA, as previously described with reference to FIG. 6.

If ECC1 632 is unable to correct an identified error using the SECDED algorithm, ECC1 632 uses the DECTED algorithm to try to correct the error. The DECTED algorithm operates on the combined 512-bit data value using the seventeen-bit set of DECTED ECC checkbits that are partially stored with each 128-bit data word, and ECC1 632 provides result 8302. For example, a logic-high value of result 8302 indicates that ECC1 632 was able to correct the error. A logic-low value of result 8302 indicates that the error could not be corrected. If ECC1 632 is able to correct the error using the DECTED algorithm, the four 128-bit data words can be written to L2 cache memory 124 or provided at output node DATA, as previously described with reference to FIG. 6. If ECC1 632 is unable to correct the error, the required data can be accessed from external memory 130.

The techniques described herein can be combined with additional methods to improve the reliability of a data processing device. For example, a cache memory such as L3 cache memory 122 can include bit-line interleaving to prevent a single radiation event from creating more than one soft error at a single 128-bit data word.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

For example, the particular combination of SECDED and DECTED error correction algorithms are described, but another combination of error correction algorithms can be used. For example, each 128-bit data word can be evaluated using parity, and a DECTED algorithm performed on the 512-bit data value if a parity error is identified. In another embodiment, L1 cache memory 126 can also use ECC techniques to provide error detection and correction. The example illustrated herein includes four 128-bit data words, but a different number of data words can be included in a burst, and each data word can include a greater or fewer number of bits. Furthermore, the set of DECTED ECC checkbits can be distributed amongst a greater or fewer number of data words. The term "word" as described herein is used generally to describe a set of bits that can be the same or different from the number of bits associated with a cache line. For example, a cache line can contain one or more data words as described herein.

Individual error correction modules can be included at each cache memory to facilitate simultaneous error detection and correction at each cache memory, such as illustrated at FIG. 6. In another embodiment, an error correction module can be shared by more than one cache memory. For example, SECDED ECC module 6321 at FIG. 6 can be shared by L3 cache memory 122 and L2 cache memory 124. In another embodiment error correction module 632 can be shared by L3 cache memory 122 and L2 cache memory 124.

In the particular embodiment illustrated, cache memories 122, 124, and 126 are included a data processing device 105. Data processing device 105 may include a single IC, or can include multiple ICs. For example, L1 cache memory 126, L2 cache memory 124, and L3 cache memory 122 can be included at a single IC along with CPU 110. In another embodiment, L3 cache memory 122 can be included at another IC.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
    performing a first error detection for a first data word using a first error correction code (ECC) based upon the first data word; and
    in response to the first error detection indicating an error at the first data word that is uncorrectable based upon the first ECC, performing a second error detection for a plurality of data words including the first data word and a second data word, using a second ECC based upon the first and second data words, wherein the first error detection is based upon a first algorithm, the second error detection is based upon a second algorithm, and wherein error detection based upon the first algorithm is performed on data words accessed from a first cache and from a second cache, and error detection based upon the second algorithm is performed on data words accessed from the first cache and not performed on data words accessed from the second cache.

2. The method of claim 1, wherein the first ECC, the second ECC and the plurality of data words are received from the first cache.

3. The method of claim 1 further comprising:
    in response to the first error detection indicating an error at the first data word that is correctable based upon the first ECC, correcting the correctable error at the first data word to generate a corrected first data word; and
    storing the corrected first data word and the first ECC to the second cache.

4. The method of claim 1, further comprising:
    in response to the first error detection indicating an error at the first data word that is correctable based upon the first ECC, correcting the correctable error at the first data word to generate a corrected first data word; and
    storing the corrected first data word and not the second ECC to the second cache.

5. The method of claim 1, wherein the second ECC includes a greater number of data bits and can correct a greater number of bit errors than the first ECC.

6. The method of claim 1, further comprising:
    performing a third error detection for the second data word using a third ECC; and in response to the third error detection indicating an error at the second data word that is uncorrectable based upon the third ECC, performing the second error detection for the plurality of data words including the first data word and the second data word, using the second ECC.

7. The method of claim 6, wherein the first data word and the second data word are associated with a common burst access at the first cache.

8. The method of claim 1, wherein performing first error detection comprises performing first error detection in response to receiving the first data word and the first ECC from the first cache, and further comprising:
    correcting a correctable error at the at the first data word in response to detecting a correctable error; and
    storing the corrected first data word at the second cache.

9. The method of claim 8, wherein storing the corrected data comprises storing the corrected data at the second cache with the first ECC.

10. The method of claim 1, wherein the first error detection is part of an error detection/correction algorithm that deterministically detects two or fewer bit errors and corrects a single-bit error based upon the first ECC, and the second error detection is part of an error detection/correction algorithm that deterministically detects three or fewer bit errors and corrects two or fewer bit error based upon the ECC.

11. The method of claim 1, wherein correcting the correctable error at the first data word further comprises providing the corrected first data word to a central processing unit.

12. A method, comprising:
receiving a plurality of data words including a first data word and a second data word;
determining a first ECC based on the first data word and not on the second data word;
determining a second ECC based on the second data word and not on the first data word;
determining a third ECC based on the plurality of data words; and
storing the first data word, the second data word, the first ECC, the second ECC, and the third ECC to a memory, wherein storing comprises:
storing the first ECC and the first data word wherein the first data word and the first ECC are retrieved from Memory based on a first memory access;
storing a first portion of the third ECC and the first data word wherein the first portion and the first data word are retrieved from memory based on the first memory access;
storing the second ECC and the second data word wherein the second data word and the second ECC are retrieved from memory based on a second memory access; and
storing a second portion of the third ECC and the second data word wherein the second portion and the second data word are retrieved from memory based on the second memory access.

13. The method of claim 12, further comprising:
performing a first error detection for the first data word using the first ECC; and
in response to the first error detection indicating a first uncorrected error, performing a second error detection for the first data word and the second data word using the third ECC.

14. The method of claim 12, further comprising:
performing a third error detection for the second data word using the second ECC; and
in response to the third error detection indicating a first uncorrectable error, performing a second error detection for the first data word and the second data word using the third ECC.

15. A device, comprising:
a first memory configured to store:
a first data word;
a first ECC configured to detect and correct an error with the first data word, the first ECC based only upon the first data word; and
a second ECC based upon a plurality of data words including the first data word and a second data word;
a first ECC module coupled to the first memory, the first ECC module configured to:
perform a first error detection for the first data word using the first ECC; and
a second ECC module coupled to the first memory, the second ECC module configured to:
perform a second error detection for the plurality of data words using the second ECC in response to the first error detection indicating a first uncorrected error, wherein the first error detection is based upon a first algorithm, the second error detection is based upon a second algorithm, and wherein error detection based upon the first algorithm is performed on data words accessed from the first memory and from a second memory, and error detection based upon the second algorithm is performed on data words accessed from the first memory and not performed on data words accessed from the second memory.

16. The device of claim 15, wherein:
the first memory is configured to store:
a second data word; and
a third ECC based only upon the second data word; and
the first ECC module is configured to:
perform a third error detection for the second data word using the third ECC; and
in response to the third error detection indicating a second error, performing a fourth error detection for the plurality of data words using the second ECC.

17. The device of claim 16, wherein the first ECC module is configured to:
determine the first ECC based only on the first data word;
determine the third ECC based only on the second data word; and
wherein the second ECC module is configured to:
determine the second ECC based on the plurality of data words.

18. The device of claim 15, wherein the second ECC module is configured to determine first corrected data in response to the second error detection and the second memory is configured to receive the first corrected data.

19. The device of claim 15, wherein the first memory comprises a first cache associated with a data processing device and the second memory comprises a second cache associated with the data processing device.

20. The device of claim 15, wherein the first data word and the second data word are associated with a common burst access at the first memory.

* * * * *

UNITED STATES PATENT AND TRADEMARK OFFICE
CERTIFICATE OF CORRECTION

| | | |
|---|---|---|
| PATENT NO. | : 8,276,039 B2 | Page 1 of 1 |
| APPLICATION NO. | : 12/394701 | |
| DATED | : September 25, 2012 | |
| INVENTOR(S) | : John J. Wuu et al. | |

It is certified that error appears in the above-identified patent and that said Letters Patent is hereby corrected as shown below:

On the Title page of the patent, Item (75), please correct inventor name "Samuel D. Naffziger" to be --Samuel D. Naffiziger--

Signed and Sealed this
Twenty-ninth Day of January, 2013

David J. Kappos
*Director of the United States Patent and Trademark Office*